United States Patent
Chang et al.

(10) Patent No.: US 10,236,469 B2
(45) Date of Patent: Mar. 19, 2019

(54) DISPLAY DEVICE AND DETECTION METHOD THEREOF

(71) Applicant: InnoLux Corporation, Miao-Li County (TW)

(72) Inventors: Chia-Yuan Chang, Miao-Li County (TW); Chia-Chieh Fan, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 4 days.

(21) Appl. No.: 15/621,212

(22) Filed: Jun. 13, 2017

(65) Prior Publication Data
US 2017/0365811 A1    Dec. 21, 2017

(30) Foreign Application Priority Data
Jun. 16, 2016    (CN) .......................... 2016 1 0429534

(51) Int. Cl.
| | |
|---|---|
| *H01L 33/00* | (2010.01) |
| *H01L 51/52* | (2006.01) |
| *G01S 7/06* | (2006.01) |
| *G02F 1/1345* | (2006.01) |
| *H03K 19/177* | (2006.01) |
| *H01L 27/32* | (2006.01) |

(52) U.S. Cl.
CPC .......... *H01L 51/5246* (2013.01); *G01S 7/064* (2013.01); *G02F 1/13452* (2013.01); *G02F 1/13458* (2013.01); *H01L 27/3276* (2013.01); *H03K 19/17704* (2013.01); *H03K 19/17776* (2013.01); *H01L 2224/0401* (2013.01)

(58) Field of Classification Search
CPC ............ H01L 27/3276; H01L 27/3297; H05K 2201/0979; H05K 2201/09663
See application file for complete search history.

(56) References Cited

U.S. PATENT DOCUMENTS

| | | | | |
|---|---|---|---|---|
| 8,305,869 | B2 * | 11/2012 | Kitayama ................ | G11B 7/13 369/124.01 |
| 2008/0050982 | A1 * | 2/2008 | Kaneko .............. | G01R 31/2818 439/721 |
| 2009/0040902 | A1 * | 2/2009 | Kamel ..................... | G11B 7/22 369/100 |
| 2010/0290331 | A1 * | 11/2010 | Kaizaki .................. | G11B 7/126 369/100 |
| 2015/0098197 | A1 * | 4/2015 | Abe ....................... | H01R 12/62 361/749 |

* cited by examiner

*Primary Examiner* — Kevin M Picardat
(74) *Attorney, Agent, or Firm* — Muncy, Geissler, Olds & Lowe, P.C.

(57) ABSTRACT

A display device includes a display panel, a driving circuit board, and an electronic connector. The electronic connector connects the display panel and the driving circuit board. The driving circuit board is configured with a first wire, a second wire, a third wire, a fourth wire and a fifth wire arranged in order. The first wire, the second wire, the third wire and the fifth wire extend to the electronic connector and connect to the display panel. A first convergence point of the second wire and the third wire is located on the electronic connector, and a second convergence point of the fourth wire and the third wire is located on the driving circuit board. A detection method of the display device is also disclosed.

17 Claims, 7 Drawing Sheets

DISPLAY DEVICE AND DETECTION METHOD THEREOF

CROSS REFERENCE TO RELATED APPLICATIONS

This Non-provisional application claims priority under 35 U.S.C. § 119(a) on Patent Application No(s). 201610429534.5 filed in People's Republic of China on Jun. 16, 2016, the entire contents of which are hereby incorporated by reference.

BACKGROUND

Technical Field

This disclosure relates to a display device and a detection method thereof.

Related Art

In general, the display device needs a series of detections in the assembling procedure for ensuring various functions of the display device to be normally operated. The display device includes a display panel and at least one driving circuit board. The driving circuit board is connected to the display panel via a flexible printed circuit for driving the display panel. In the detection procedure, it is necessary to detect and check the resistance of the flexible printed circuit connecting to the display panel and the resistance of the flexible printed circuit connecting to the driving circuit board.

SUMMARY

The disclosure provides a display device includes a display panel, a driving circuit board, and an electronic connector. The electronic connector connects the display panel and the driving circuit board. The driving circuit board is configured with a first wire, a second wire, a third wire, a fourth wire and a fifth wire arranged in order. The first wire, the second wire, the third wire and the fifth wire extend to the electronic connector and connect to the display panel. A first convergence point of the second wire and the third wire is located on the electronic connector, and a second convergence point of the fourth wire and the third wire is located on the driving circuit board.

The disclosure also provides a resistance detection method of wires of the display device. The resistance detection method includes steps of providing a first probe, a second probe, a third probe, a fourth probe and a fifth probe to couple with a first wire, a second wire, a third wire, a fourth wire and a fifth wire, respectively; applying an input voltage to the first probe; receiving an output voltage through the third probe; applying an input current to the second probe when applying the input voltage to the first probe; and receiving an output current through one of the fourth probe and the fifth probe.

As mentioned above, the display device of the disclosure has a first wire, a second wire, a third wire, a fourth wire and a fifth wire disposed on the driving circuit board arranged in order. The first wire, the second wire, the third wire and the fifth wire extend to the electronic connector and connect to the display panel. A first convergence point of the second wire and the third wire is located on the electronic connector, and a second convergence point of the fourth wire and the third wire is located on the driving circuit board. When detecting the display device, the resistance detection of the electronic connector in the display panel doesn't include the resistance of the wires in the display panel. This feature can sufficiently increase the accuracy of the resistance detection. Besides, the display device can be detected by five probes in one detection procedure, so that the total detection steps, periods and errors can be reduced. This feature is benefit to automation.

BRIEF DESCRIPTION OF THE DRAWINGS

The embodiments will become more fully understood from the detailed description and accompanying drawings, which are given for illustration only, and thus are not limitative of the present disclosure, and wherein.

DETAILED DESCRIPTION OF THE INVENTION

The embodiments of the disclosure will be apparent from the following detailed description, which proceeds with reference to the accompanying drawings, wherein the same references relate to the same elements.

Figure 1A:
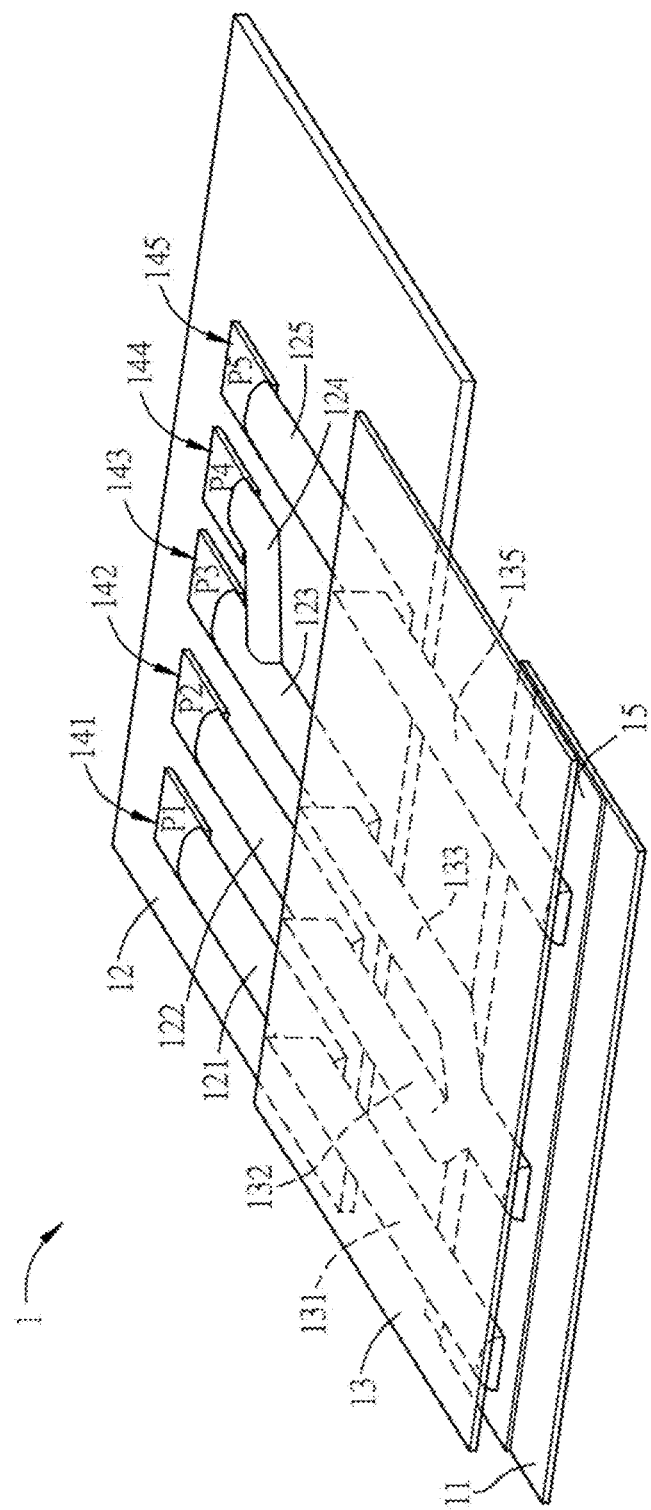
FIGS. 1A and 1B are schematic diagrams of a display device according an embodiment of the disclosure.
Figure 1B:
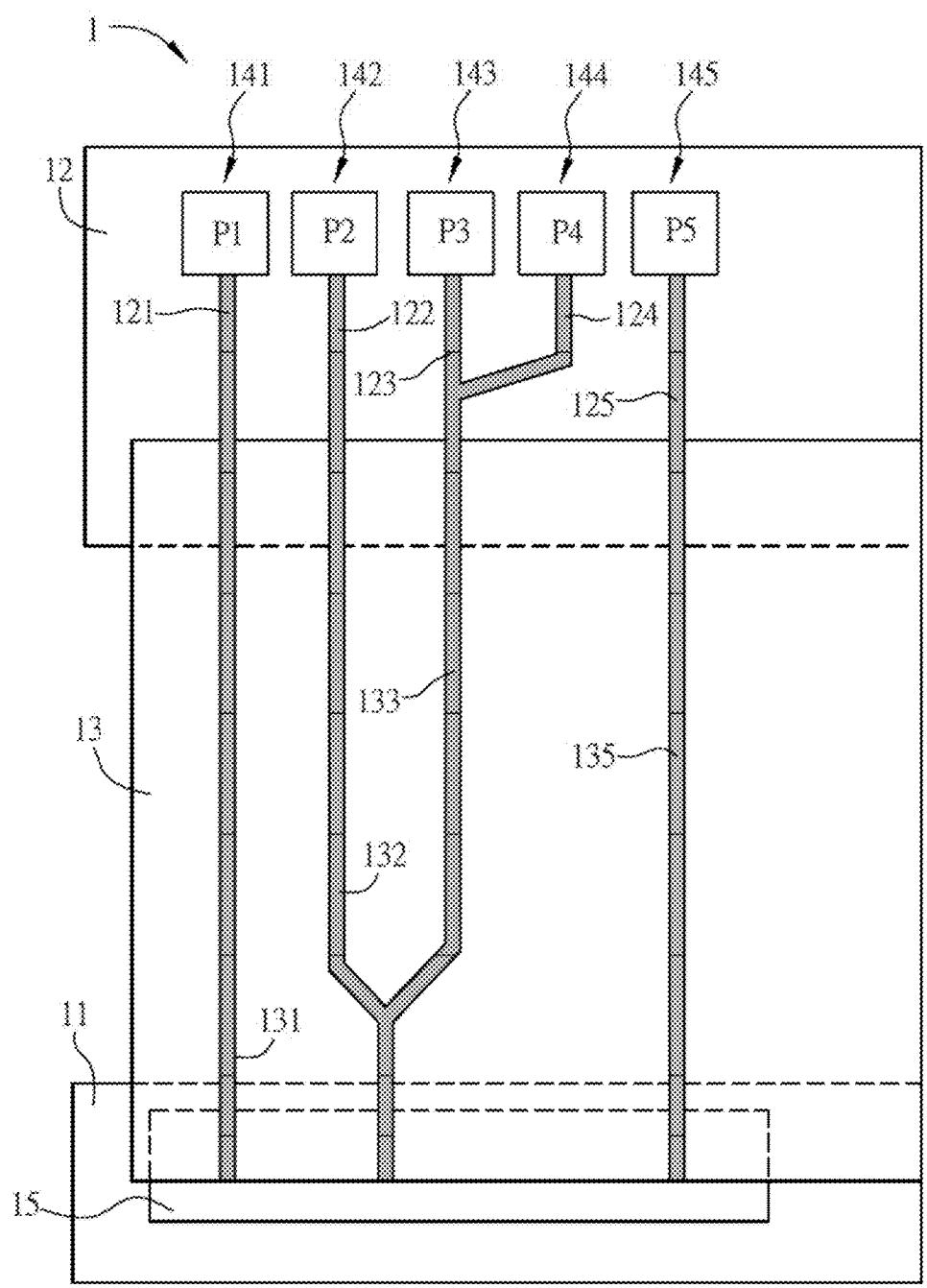

FIG. 1A is a schematic diagram of a display device 1 according an embodiment of the disclosure; and FIG. 1B is a top view of the display device 1. As shown in FIGS. 1A and 1B, the display device 1 includes a display panel 11, a driving circuit board 12, an electronic connector 13 and a conductive layer 15. In this embodiment, the display panel 11 is, for example, an LCD (liquid crystal display) device, an LED (light emitting diode) display panel, an OLED (Organic light emitting diode) display panel or the likes, and this embodiment is not limited. The electronic connector 13 connects to the display panel 11 and the driving circuit board 12, and the driving circuit board 12 is configured for driving the display panel 11 to enable the display panel 11 to display image. Of course, the display panel 11 can be further driven to display image through other circuit boards. In addition, if the display panel 11 is a non-self-luminous display panel, it is needed to configure a backlight module for achieving the display function. The conductive layer 15 is disposed between the display panel 11 and the electronic connector 13. The electronic connector 13 is, for example, a flexible printed circuit (FPC) a chip on film (COF), or other kinds of connector types, and this disclosure is not limited. The conductive layer 15 is a conductive pattern located adjacent to the border of the display panel 11. The material of the conductive layer 15 comprises copper, aluminum, or other kind of conductive metals or metal oxides, but not limited to.

In this embodiment, a first wire 141, a second wire 142, a third wire 143, a fourth wire 144 and a fifth wire 145 are configured on the driving circuit board 12 in order. The first wire 141, the second wire 142, the third wire 143 and the fifth wire 145 extend to the electronic connector 13 and connect to the display panel 11. A convergence point of the second wire 142 and the third wire 143 is located on the electronic connector 13, and a convergence point of the third wire 143 and the fourth wire 144 is located on the driving circuit board 12.

In this embodiment, a wire segment 121 of the driving circuit board 12 is connected to a connecting pad P1 of the driving circuit board 12 and a wire segment 131 of the electronic connector 13 to form the first wire 141. Similarly, a wire segment 122 of the driving circuit board 12 is connected to a connecting pad P2 of the driving circuit board 12 and a wire segment 132 of the electronic connector 13 to form the second wire 142. A wire segment 123 of the driving circuit board 12 is connected to a connecting pad P3 of the driving circuit board 12 and a wire segment 133 of the electronic connector 13 to form the third wire 143. A wire segment 125 of the driving circuit board 12 is connected to a connecting pad P5 of the driving circuit board 12 and a wire segment 135 of the electronic connector 13 to form the fifth wire 145. In addition, a connecting pad P4 of the driving circuit board 12 is connected to a wire segment 124 of the driving circuit board 12 to form the fourth wire 144. In this embodiment, the electronic connector 13 is connected to the driving circuit board 12 or the conductive layer 15 of the display panel 11 by bonding process, and the above-mentioned wire segments can be connected to the corresponding connecting pads by bonding process. This embodiment is not limited thereto.

In addition, a convergence point of the second wire 142 and the third wire 143 is located on the electronic connector 13. In this embodiment, a part of the wire segment 132 of the second wire 142 is connected to a part of the wire segment 133 of the third wire 143. Herein, the convergence point of the second wire 142 and the third wire 143 is located at one side of the electronic connector 13 adjacent to the display panel 11.

A convergence point of the third wire 143 and the fourth wire 144 is located on the driving circuit board 12. In this embodiment, a first side of a wire segment 124 of the fourth wire 144 is connected to a wire segment 123 of the third wire 143 and a second side of the wire segment 124 of the fourth wire 144 opposite to the first side is connected to the connecting pad P4.

Figure 2A:
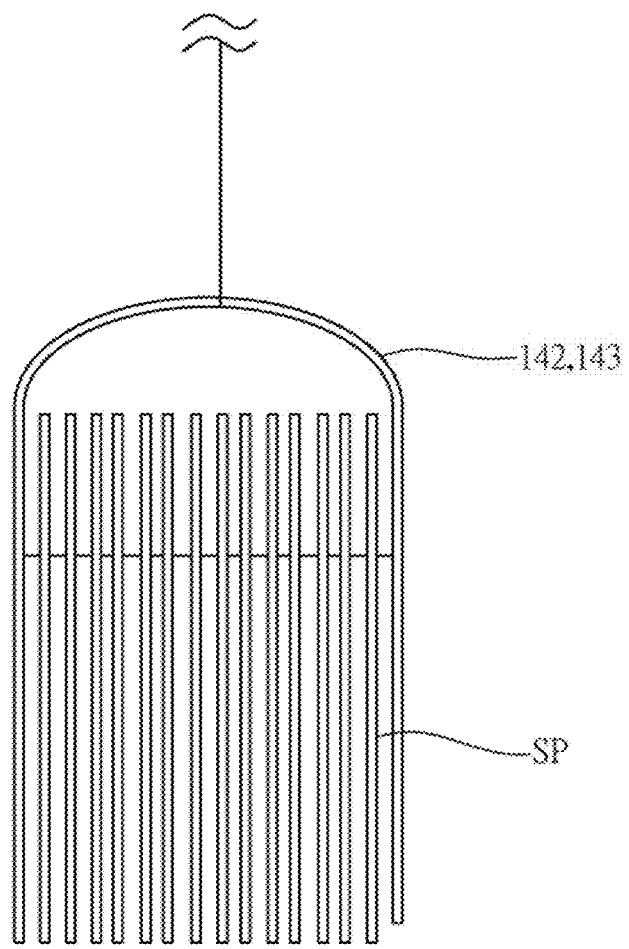
FIG. 2A is a schematic diagram showing the connection of the second wire and the third wire, which contain a plurality of connecting sub-pads.
Figure 2B:
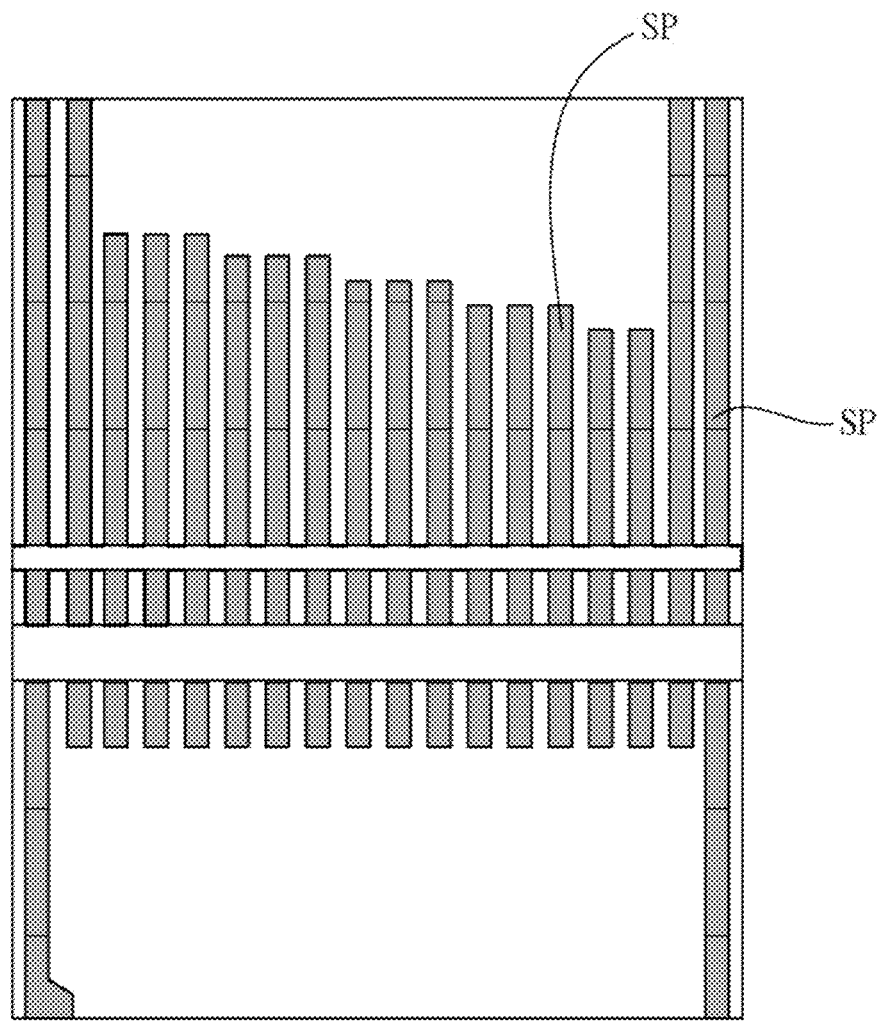
FIG. 2B is a schematic diagram showing an enlarged connecting sub-pad of FIG. 2A.

In this embodiment, as shown in FIGS. 2A and 2B, one side of the first wire 141, the second wire 142, the third wire 143 or the fifth wire 145 adjacent to the display panel 11 has a plurality of connecting sub-pads SP. In FIG. 2A, one side of the second wire 142 and the third wire 143, which are connected to each other, are configured with a plurality of connecting sub-pads SP. FIG. 2B shows the enlarged schematic diagram of the connecting sub-pads SP. As shown in FIGS. 2A and 2B, the connecting sub-pads SP may have different lengths or widths.

According to the design of the first wire 141, the second wire 142, the third wire 143, the fourth wire 144 and the fifth wire 145 as mentioned above, the detection performance can be sufficiently improved. The detection method according to an embodiment of the disclosure will be described hereinafter with reference to FIGS. 3 and 4.

Figure 3:
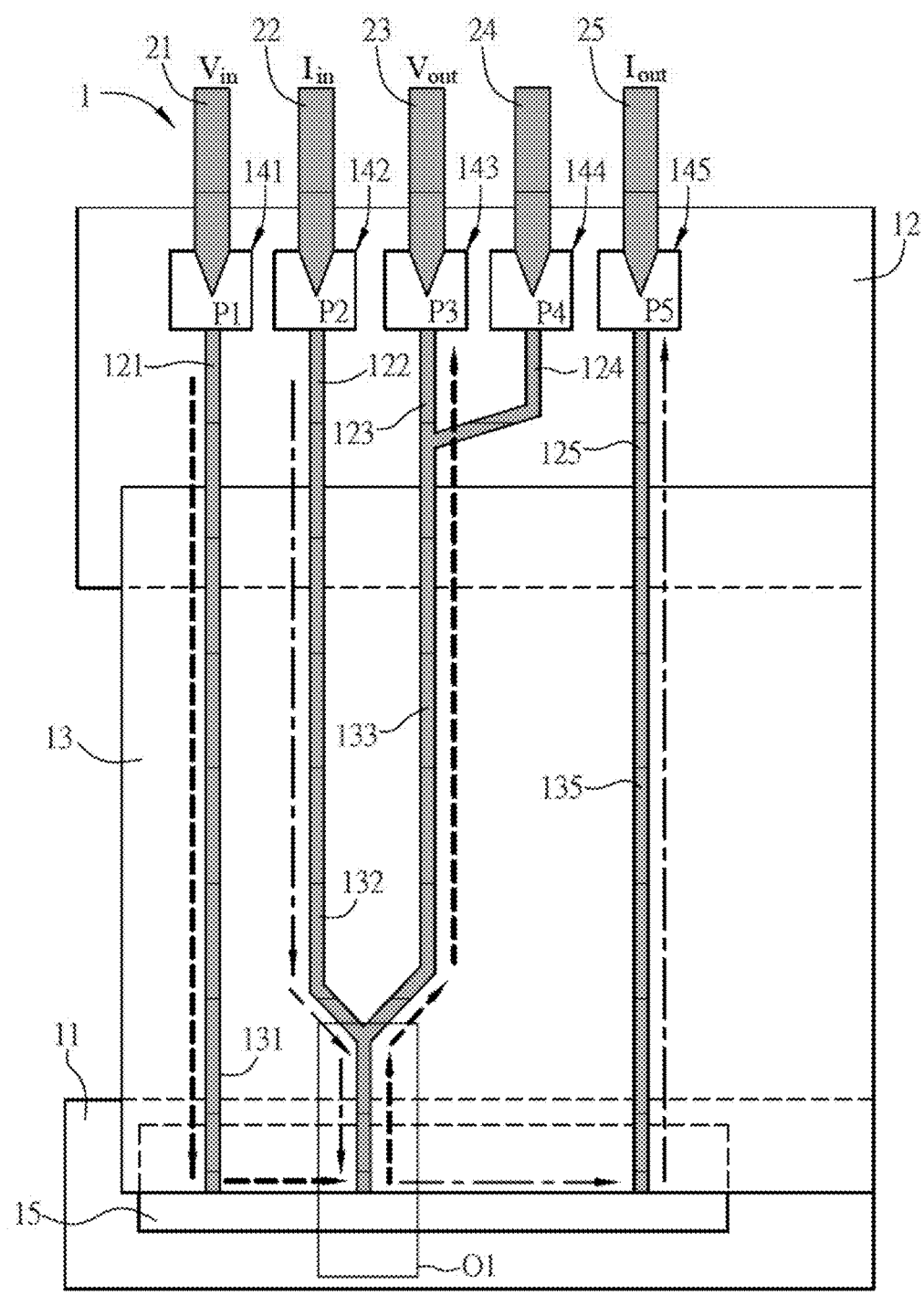
FIGS. 3 and 4 are schematic diagrams referring to the detection method according to an embodiment of the disclosure.

FIG. 3 is a schematic diagram referring to a detection method for detecting the resistance of the electronic connector 13 connecting to the conductive layer 15 of the display panel 11. At first, five probes 21~25 are provided to couple with the first wire 141, the second wire 142, the third wire 143, the fourth wire 144 and the fifth wire 145, respectively. In this embodiment, the five probes 21~25 contact with the connecting pads P1, P2, P3, P4 and P5, respectively. Next, an input voltage $V_{in}$ is applied to the probe 21, and an output voltage $V_{out}$ is received through the conductive layer 15 via the probe 23, which contacts with the connecting pad P3. When inputting the input voltage $V_{in}$, an input current $I_{in}$ is also applied to the probe 22, and an output current $I_{out}$ is received through the conductive layer 15 via the probe 25, which contacts with the connecting pad P5. The voltage path and the current path can be referred to the dotted lines in FIG. 3. As shown in FIG. 3, the overlapped part O1 of the voltage path and the current path includes a part of the electronic connector 13 adjacent to the display panel 11 and a part of the conductive layer 15. The overlapped part O1 of the voltage path and the current path doesn't include wires of the display region or peripheral region of the display panel 11. In other words, the resistance of wires of the display region and peripheral region of the display panel 11 are not counted in this resistance detection method, the resistance detection method counted the resistance between the electronic connector 13 and the conductive layer 15 so that the accuracy of the resistance detection can be sufficiently improved.

Figure 4:
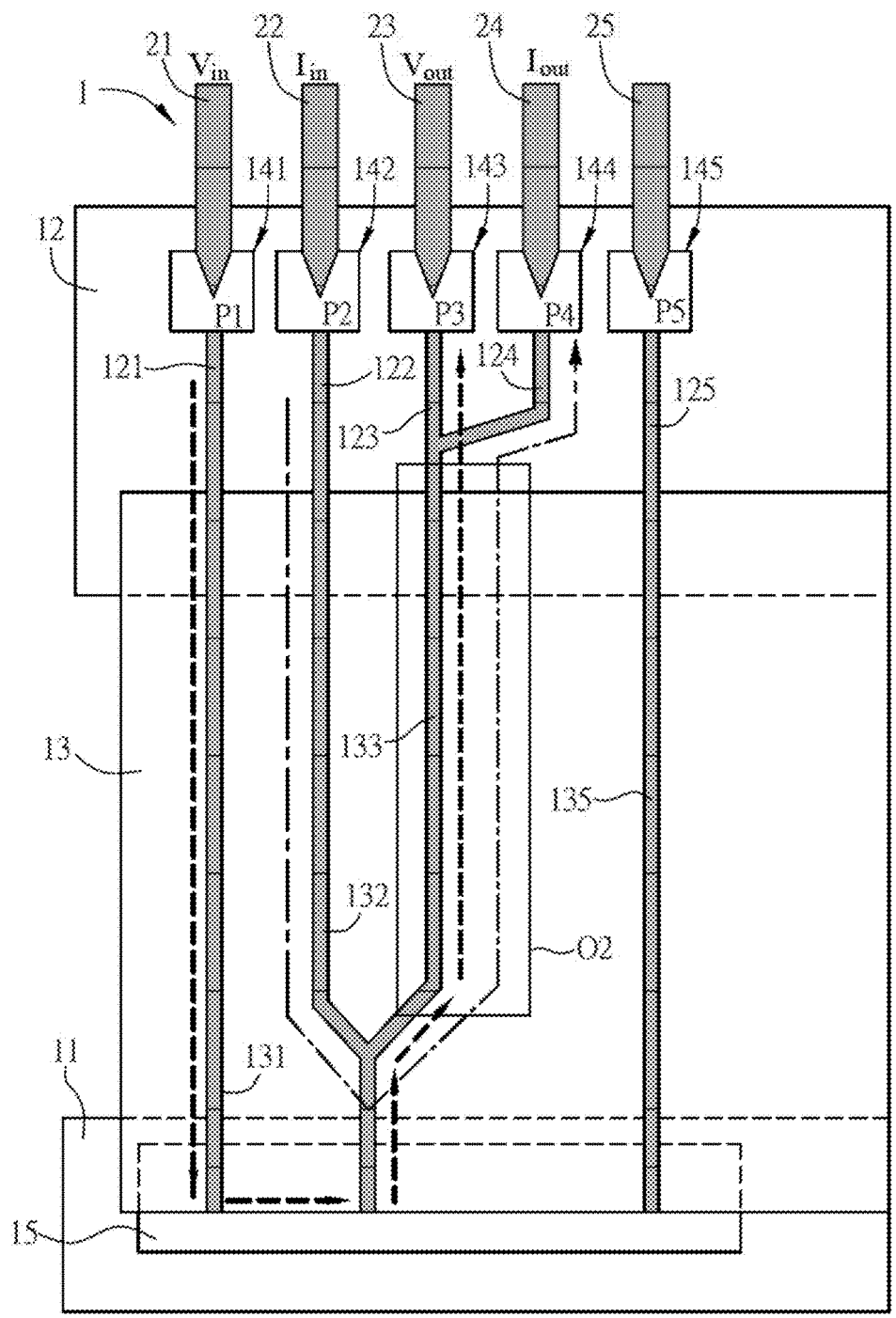

FIG. 4 is a schematic diagram referring to a detection method for detecting the resistance of one side of the electronic connector 13 connecting to the driving circuit board 12. In the previous detection method, the five probes 21~25 couple with the first wire 141, the second wire 142, the third wire 143, the fourth wire 144 and the fifth wire 145, respectively, so the current detection method does not need to install the probes 21~25 again. Then, an input voltage $V_{in}$ is applied to the probe 21, and an output voltage $V_{out}$ is received through the conductive layer 15 via the probe 23, which contacts with the connecting pad P3. When inputting the voltage $V_{in}$, an input current $I_{in}$ is also applied to the probe 22, and an output current $I_{out}$ is received through the conductive layer 15 via the probe 24, which contacts with the connecting pad P4. The voltage path and the current path can be referred to the dotted lines in FIG. 4. As shown in FIG. 4, the overlapped part O2 of the voltage path and the current path includes a part of the wire segment 133 of the electronic connector 13 adjacent to the driving circuit board 12. The overlapped part O2 of the voltage path and the current path doesn't include wires of the display region or peripheral region of the display panel 11. In other words, the resistance of the wires of the display region and peripheral region of the display panel 11 are not counted in this resistance detection method, and the resistance detection method counts the resistance of wires between the electronic connector 13 and the driving circuit board 12, so that the resistance of the detection accuracy can be sufficiently improved.

Figure 5:
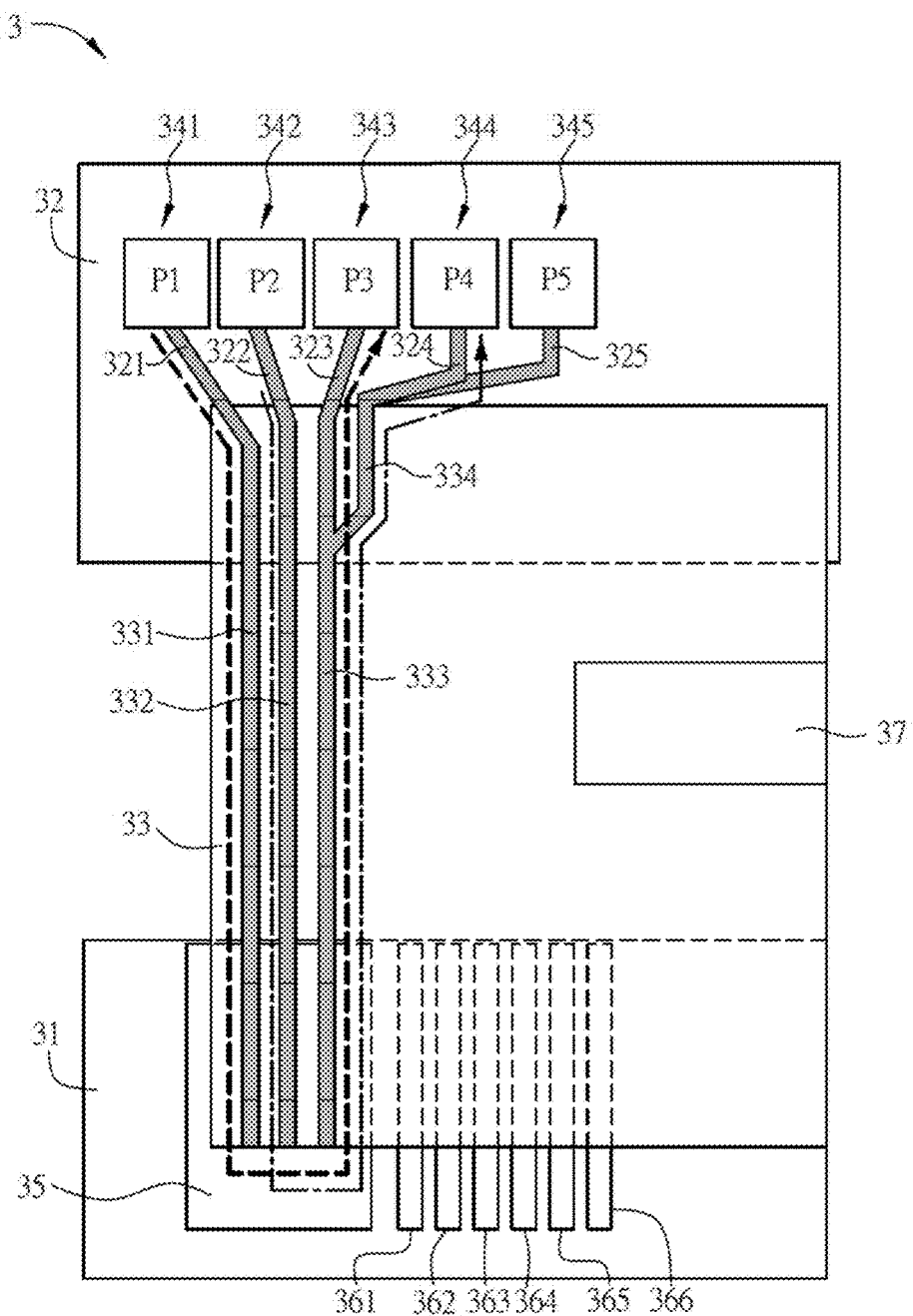
FIG. 5 is a schematic diagram showing another display device.

FIG. 5 is a schematic diagram showing another display device. As shown in FIG. 5, the display device 3 includes a display panel 31, a driving circuit board 32 and an electronic connector 33. The electronic connector 33 connects the display panel 31 and the driving circuit board 32. A first wire 341, a second wire 342, a third wire 343, a fourth wire 344, and a fifth wire 345 are configured on the driving circuit board 32, the electronic connector 33 and the display panel 31 in order. The first wire 341, the second wire 342, the third wire 343 and the fourth wire 344 are disposed on the driving circuit board 32 and the electronic connector 33, and the fifth wire 345 is disposed on the driving circuit board 32.

In this embodiment, a wire segment 321 of the driving circuit board 32 is connected to a connecting pad P1 of the driving circuit board 32 and a wire segment 331 of the electronic connector 33 to form the first wire 341. Similarly, a wire segment 322 of the driving circuit board 32 is connected to a connecting pad P2 of the driving circuit board 32 and a wire segment 332 of the electronic connector 33 to form the second wire 342. A wire segment 323 of the driving circuit board 32 is connected to a connecting pad P3 of the driving circuit board 32 and a wire segment 333 of the electronic connector 33 to form the third wire 343. A wire segment 324 of the driving circuit board 32 is connected to a connecting pad P4 of the driving circuit board 32 and a wire segment 334 of the electronic connector 33 to form the fourth wire 344. In addition, a connecting pad P5 of the driving circuit board 32 is connected to a wire segment 325 of the driving circuit board 32 to form the fifth wire 345.

In this embodiment, a part of the third wire 343 is connected to a part of the fourth wire 344 in the electronic connector 33. Herein, a part of the wire segment 333 of the third wire 343 is connected to a part of the wire segment 334 of the fourth wire 344 in the electronic connector 33.

In addition, a side of the fifth wire 345 is connected to the fourth wire 344 on the driving circuit board 32. Herein, the side of the wire segment 325 of the fifth wire 345 is connected to the wire segment 324 of the fourth wire 344 on the driving circuit board 32.

Moreover, a conductive layer 35 is disposed between the display panel 31 and the electronic connector 33. The conductive layer 35 is a conductive pattern located adjacent to the border of the display panel 31. The material of the conductive layer 35 comprises copper, aluminum, or other kind of conductive metals or metal oxides, but this disclosure is not limited thereto. Other features of the conductive layer 35 can be comprehended by referring to the above embodiments of the conductive layer 15, so the related description is omitted here for conciseness.

In addition, there are a plurality of conductive pads 361~366 formed on the display panel 31. The conductive pads 361~366 can be disposed adjacent to the conductive layer 35. In one embodiment, the conductive pads 361~366 are separated from the conductive layer 35. The conductive pads 361~366 can have material the same as or different from the conductive layer 35. With regard to the function, for example, the conductive layer 35 is for the above-mentioned detection method and the conductive pads 361~366 are for transmitting signals, such as the driving signals. Therefore, the electronic connector 33 with a driver IC 37 can be bonded on the conductive pads 361~366 to transmit or receive the signals. In FIG. 5, the electronic connector 13 with the driver IC 37 is called a chip on film (COF). In one embodiment, the conductive layer 35 and the conductive pads 361~366 can be formed on the display panel 31 within the same manufacturing process. To be noted, the features of the conductive pads 361~366 mentioned here also apply to the above embodiments.

In summary, the display device of the disclosure has a first wire, a second wire, a third wire, a fourth wire and a fifth wire disposed on the driving circuit board arranged in order. The first wire, the second wire, the third wire and the fifth wire extend to the electronic connector and connect to the display panel. A first convergence point of the second wire and the third wire is located on the electronic connector, and a second convergence point of the fourth wire and the third wire is located on the driving circuit board. When detecting the display device, the resistance detection of the electronic connector in the display panel doesn't include the resistance of the wires of the display region and peripheral region of the display panel. This feature can sufficiently increase the accuracy of the resistance detection. Besides, the display device can be detected by five probes in one detection procedure, so that the total detection steps, periods and errors can be reduced. This feature is benefit to automation.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A display device, comprising:
   a display panel;
   a driving circuit board; and
   an electronic connector connecting the display panel and the driving circuit board;
   wherein the driving circuit board is configured with a first wire, a second wire, a third wire, a fourth wire and a fifth wire arranged in order, the first wire, the second wire, the third wire and the fifth wire extend to the electronic connector and connect to the display panel, a first convergence point of the second wire and the third wire is located on the electronic connector, the first convergence point is not directly above the display panel, and a second convergence point of the third wire and the fourth wire is located on the driving circuit board.

2. The display device of claim 1, wherein a wire segment of the driving circuit board is correspondingly connected to a connecting pad of the driving circuit board and a wire segment of the electronic connector to form one of the first wire, the second wire, the third wire and the fifth wire.

3. The display device of claim 1, wherein the electronic connector is a flexible printed circuit.

4. The display device of claim 1, wherein a wire segment of the driving circuit board is connected to a connecting pad of the driving circuit board to form the fourth wire.

5. The display device of claim 1, wherein the display panel comprises a conductive layer, and the conductive layer is disposed between the display panel and the electronic connector.

6. The display device of claim 1, wherein at least one of one side of the first wire, the second wire, the third wire, and the fifth wire has a plurality of connecting sub-pads.

7. The display device of claim 1, wherein the second convergence point of the second wire and the third wire is located at one side of the electronic connector adjacent to the display panel.

8. The display device of claim 6, wherein the plurality of sub-pads have different lengths or widths.

9. The display device of claim 1, wherein the electronic connector is a chip on film (COF).

10. The display device of claim 1, wherein the electronic connector is connected to the driving circuit board or the display panel by bonding process.

11. The display device of claim 1, wherein a part of a wire segment of the second wire is connected to a part of a wire segment of the third wire in the electronic connector.

12. The display device of claim 1, wherein a first side of a wire segment of the fourth wire is connected to a wire segment of the third wire on the driving circuit board, and a second side of the wire segment of the fourth wire opposite the first side is connected to a connecting pad.

13. A detection method of a display device, wherein the display device includes a display panel, a driving circuit board, and an electronic connector connecting the display panel and the driving circuit board, the driving circuit board is configured with a first wire, a second wire, a third wire, a fourth wire and a fifth wire arranged in order, the first wire, the second wire, the third wire and the fifth wire extend to the electronic connector and connect to the display panel, a first convergence point of the second wire and the third wire is located on the electronic connector, the first convergence point is not directly above the display panel, and a second convergence point of the third wire and the fourth wire is located on the driving circuit board, the detection method comprises steps of:

provi ding a first probe, a second probe, a third probe, a fourth probe and a fifth probe to couple with the first wire, the second wire, the third wire, the fourth wire and the fifth wire, respectively;

applying an input voltage to the first probe;

receiving an output voltage through the third probe;

applying an input current to the second probe when applying the input voltage to the first probe; and receiving an output current through one of the fourth probe and the fifth probe.

14. The detection method of claim 13, wherein when the fifth probe is used to receive the output current, an overlapped part of a voltage path for the input voltage and a current path for the input current includes a part of the electronic connector adjacent to the display panel and a part of the conductive layer.

15. The detection method of claim 14, further comprising a step of:

obtaining a resistance of the overlapped part by using the output voltage and the output current.

16. The detection method of claim 13, wherein when the fourth probe is used to receive the output current, an overlapped part of a voltage path for the input voltage and a current path for the input current includes a part of the electronic connector adjacent to the driving circuit board.

17. The detection method of claim 16, further comprising a step of:

obtaining a resistance of the overlapped part by using the output voltage and the output current.

* * * * *